(12) United States Patent  
Hampl et al.

(10) Patent No.: US 12,068,296 B2  
(45) Date of Patent: Aug. 20, 2024

(54) METHOD FOR WAFER BONDING AND COMPOUND SEMICONDUCTOR WAFER

(71) Applicant: Infineon Technologies AG, Neubiberg (DE)

(72) Inventors: Stefan Hampl, Dresden (DE); Marco Haubold, Dresden (DE); Kerstin Kaemmer, Radebeul (DE); Norbert Thyssen, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 134 days.

(21) Appl. No.: 17/583,545

(22) Filed: Jan. 25, 2022

(65) Prior Publication Data

US 2022/0238501 A1 Jul. 28, 2022

(30) Foreign Application Priority Data

Jan. 26, 2021 (EP) ..................... 21153413

(51) Int. Cl.
*H01L 25/16* (2023.01)
*H01L 23/00* (2006.01)

(52) U.S. Cl.
CPC ............ *H01L 25/167* (2013.01); *H01L 24/29* (2013.01); *H01L 24/32* (2013.01); *H01L 24/83* (2013.01);
(Continued)

(58) Field of Classification Search
CPC ....... H01L 24/29; H01L 24/32; H01L 25/167; H01L 24/94; H01L 21/6835; H01L 21/7806; H01L 24/83; H01L 24/06; H01L 24/05; H01L 33/0095; H01L 21/7813; H01L 25/072; H01L 24/95; H01L 24/49; H01L 24/48; H01L 24/73; H01S 5/0202; H01S 5/18352; H01S 5/34333; H01S 5/18369; H01S 5/18341; H01S 5/0014; H01L 2224/2929; H01L 2224/32502; H01L 2924/10252; H01L 2224/32225; H01L 2224/0603; H01L 2924/01322; H01L 2224/32245; H01L 2224/06131; H01L 2224/06135; H01L 2224/04026; H01L 2221/6835; H01L 2924/14;
(Continued)

(56) References Cited

U.S. PATENT DOCUMENTS

2002/0076904 A1 6/2002 Imler
2007/0155055 A1 7/2007 Yang
(Continued)

*Primary Examiner* — Mouloucoulaye Inoussa
(74) *Attorney, Agent, or Firm* — Murphy, Bilak & Homiller, PLLC

(57) ABSTRACT

A method for wafer bonding includes: providing a semiconductor wafer having a first main face; fabricating at least one semiconductor device in the semiconductor wafer, wherein the semiconductor device is arranged at the first main face; generating trenches and a cavity in the semiconductor wafer such that the at least one semiconductor device is connected to the rest of the semiconductor wafer by no more than at least one connecting pillar; arranging the semiconductor wafer on a carrier wafer such that the first main face faces the carrier wafer; attaching the at least one semiconductor device to the carrier wafer; and removing the at least one semiconductor device from the semiconductor wafer by breaking the at least one connecting pillar.

15 Claims, 6 Drawing Sheets

(52) U.S. Cl.
CPC ............... *H01L 2224/29124* (2013.01); *H01L 2224/32145* (2013.01); *H01L 2224/83805* (2013.01); *H01L 2924/01032* (2013.01); *H01L 2924/01322* (2013.01)

(58) Field of Classification Search
CPC . H01L 2224/05554; H01L 2221/68363; H01L 2924/01032; H01L 2224/06177; H01L 2224/94; H01L 2224/293; H01L 2224/32145; H01L 2924/1203; H01L 2224/291; H01L 2224/29124; H01L 2224/32506; H01L 2224/83805; H01L 2221/68318; H01L 2924/12041; H01L 2224/06181; H01L 2221/68322; H01L 2221/68381; H01L 2224/83192; H01L 2224/29144; H01L 2224/48091; H01L 2224/83001; H01L 2924/13091; H01L 2924/12032; H01L 2224/2612; H01L 2224/49113; H01L 2224/48463; H01L 2924/00014; H01L 2224/45099
USPC ................ 438/107, 28; 257/88, 13, E21.499
See application file for complete search history.

(56) References Cited

U.S. PATENT DOCUMENTS

| | | | |
|---|---|---|---|
| 2008/0014720 A1 | 1/2008 | Tyler | |
| 2012/0299128 A1 | 11/2012 | Noda et al. | |
| 2013/0130440 A1* | 5/2013 | Hu | H01L 24/95 438/107 |
| 2013/0273695 A1 | 10/2013 | Menard et al. | |
| 2014/0097521 A1 | 4/2014 | Kautzsch et al. | |
| 2014/0159066 A1* | 6/2014 | Hu | H01L 24/75 438/28 |
| 2015/0266723 A1* | 9/2015 | Chan | H04R 1/08 257/416 |
| 2016/0181476 A1* | 6/2016 | Chang | H01L 33/06 257/13 |
| 2016/0197155 A1* | 7/2016 | Hiyoshi | H01L 21/02008 257/77 |
| 2018/0190876 A1* | 7/2018 | Liu | H01L 33/62 |
| 2019/0393201 A1 | 12/2019 | Caplet et al. | |
| 2021/0384174 A1* | 12/2021 | Liu | H01L 24/95 |
| 2022/0181210 A1* | 6/2022 | Kamikawa | H01L 21/7806 |

* cited by examiner

METHOD FOR WAFER BONDING AND COMPOUND SEMICONDUCTOR WAFER

TECHNICAL FIELD

This disclosure relates in general to a method of wafer bonding as well as to a compound semiconductor wafer which may be obtained from such a method.

BACKGROUND

Every semiconductor device comprises at least one semiconductor die. However, for certain applications it may be beneficial to use a compound semiconductor device (that is, a device with at least two dies that are mechanically and/or electrically coupled to each other). For example, long range LIDAR applications may benefit from using infrared light in order to not be harmful for the human eye. However, silicon, the most commonly used semiconductor material, cannot be used to provide an efficient optical semiconductor device sensitive in the infrared spectrum. Instead, Germanium is a suitable material for such a device and it may therefore be desirable to combine a Germanium based detector or emitter with a silicon based controller. Common methods of providing such compound devices may suffer from high complexity, process inefficiency and/or high costs. Improved methods of wafer bonding as well as improved compound semiconductor devices may help with solving these and other problems.

The problem on which the invention is based is solved by the features of the independent claims. Further advantageous examples are described in the dependent claims.

SUMMARY

Various aspects pertain to a method for wafer bonding, the method comprising: providing a semiconductor wafer comprising a first main face, fabricating at least one semiconductor device in the semiconductor wafer, wherein the semiconductor device is arranged at the first main face, generating trenches and a cavity in the semiconductor wafer such that the at least one semiconductor device is connected to the rest of the semiconductor wafer by no more than at least one connecting pillar, arranging the semiconductor wafer on a carrier wafer such that the first main face faces the carrier wafer, attaching the at least one semiconductor device to the carrier wafer, and removing the semiconductor device from the semiconductor wafer by breaking the at least one connecting pillar.

Various aspects pertain to a compound semiconductor device, comprising: a first semiconductor die comprising a first main face, an opposing second main face and lateral faces connecting the first and second main faces, wherein a first semiconductor device is provided by the first semiconductor die, a second semiconductor die comprising a first main face, wherein the first main faces of the first and second semiconductor dies face each other, wherein a second semiconductor device is provided by the second semiconductor die, and an eutectic bond arranged between the first main faces and mechanically coupling the first and second semiconductor dies to each other, wherein the first semiconductor die comprises at least one mechanical fracture area on the second main face and/or the lateral faces.

BRIEF DESCRIPTION OF THE DRAWINGS

The accompanying drawings illustrate examples and together with the description serve to explain principles of the disclosure. Other examples and many of the intended advantages of the disclosure will be readily appreciated in view of the following detailed description. The elements of the drawings are not necessarily to scale relative to each other. Identical reference numerals designate corresponding similar parts.

DETAILED DESCRIPTION

In the following detailed description, directional terminology, such as "top", "bottom", "left", "right", "upper", "lower" etc. is used with reference to the orientation of the Figure(s) being described. Because components of the disclosure can be positioned in a number of different orientations, the directional terminology is used for purposes of illustration only.

Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The semiconductor dies mentioned below may have contact pads (or electrodes) which allow electrical contact to be made with the integrated circuits included in the semiconductor dies. The electrodes may be arranged all at only one main face of the semiconductor dies or at both main faces of the semiconductor dies. They may include one or more electrode metal layers which are applied to the semiconductor material of the semiconductor dies. The semiconductor dies may be bonded to a carrier. The carrier may be a (permanent) device carrier used for packaging. The carrier may comprise or consist of any sort of material as, for example, ceramic or metallic material, copper or copper alloy or iron/nickel alloy.

An efficient method of wafer bonding as well as an energy efficient compound semiconductor device may for example reduce one or more of material consumption, ohmic losses, chemical waste, etc. and may thus enable energy and/or resource savings. Improved methods of wafer bonding as well as improved compound semiconductor devices as specified in this description may thus at least indirectly contribute to green technology solutions, i.e. climate-friendly solutions providing a mitigation of energy and/or resource use.

Figure 1:
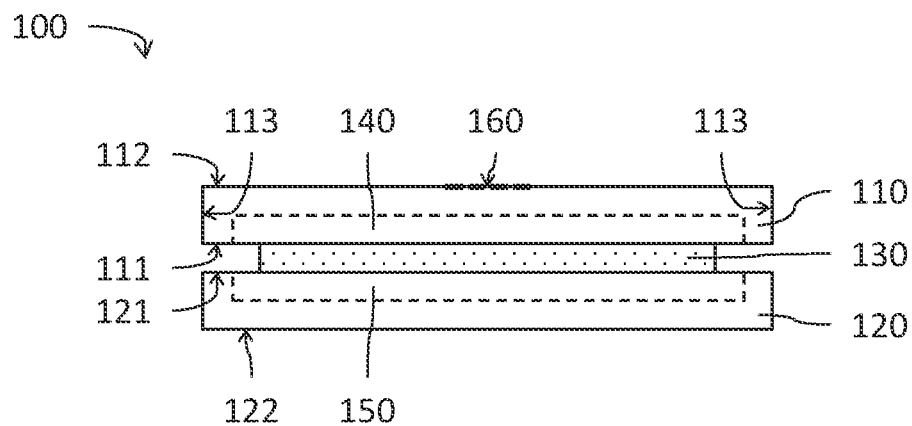
FIG. 1 shows a sectional view of a compound semiconductor device comprising two semiconductor dies attached to each other by a bond, wherein one of the semiconductor dies comprises a mechanical fracture area.

FIG. 1 shows a compound semiconductor device 100 which comprises a first semiconductor die 110, a second semiconductor die 120, and a bond 130 mechanically coupling the first and second semiconductor dies 110, 120 to each other.

The first semiconductor die 110 comprises a first main face 111, an opposing second main face 112 and lateral faces 113 connecting the first and second main faces 111, 112. The first semiconductor die 110 comprises at least one mechanical fracture area 160 on the second main face 112 and/or on one or more of the lateral faces 113. Furthermore, a first semiconductor device 140 is provided by the first semiconductor die 110.

The second semiconductor die 120 comprises a first main face 121, wherein the first main faces 111, 121 of the first and second semiconductor dies 110, 120 face each other. The second semiconductor die 120 may also comprise a second main face 122 opposite the first main face 121. Furthermore, a second semiconductor device 150 is provided by the second semiconductor die 120.

The bond 130 is arranged between the first main faces 111, 121 and mechanically couples the first and second semiconductor dies 110, 120 to each other.

The compound semiconductor device 100 may be any type of device, e.g. a sensor device, an optical device, an integrated circuit device, a power device, etc. The first semiconductor device 140 and/or the second semiconductor device 150 may for example comprise a transistor circuit, a LED, a diode (e.g. a Zener diode), an integrated circuit, a driver circuit, a power semiconductor device, a sensor, an emitter, an optical semiconductor device, a LIDAR device, an infrared device, etc. According to an example, first semiconductor device 140 is an emitter or a sensor and the second semiconductor device 150 is a controller or driver for the first semiconductor device 140.

The first and second semiconductor dies 110, 120 may comprise or consist of the same semiconductor material or different semiconductor materials. The first and second semiconductor dies 110, 120 may e.g. comprise or consist of Si, Ge, GaAs, GaN, SiC, etc. According to an example, the first semiconductor die 110 comprises or consists of Ge and the second semiconductor die 120 comprises or consists of Si.

The first and second semiconductor devices 140, 150 may for example be arranged at the respective first main faces 111, 121 as shown in the example of FIG. 1. However, it is also possible that the first and/or second semiconductor device 140, 150 is arranged at any other suitable location in the respective semiconductor die 110, 120.

The first and second semiconductor dies 110, 120 may have any suitable dimensions. For example, they may have a width measured between opposing lateral sides 113 of 500 µm or more, 1 mm or more, 5 mm or more, or 10 mm or more. The first and second semiconductor dies 110, 120 may for example each have a thickness measured between the first and second main faces 111, 112, respectively 121, 122 of 20 µm or more, 50 µm or more, 100 µm or more, 200 µm or more, 500 µm or more, or 1 mm or more. The first and second semiconductor dies 110, 120 do not necessarily have to have identical dimensions as shown in the example of FIG. 1. Instead, the first semiconductor die 110 may for example be smaller than the second semiconductor die 120.

The first and second semiconductor dies 110, 120 may comprise a semiconductor monocrystalline material and they may for example further comprise an epitaxial layer and/or an oxide layer. The oxide layer may for example be arranged at the respective first main face 111, 121. The fracture area 160 may be arranged in the semiconductor monocrystalline material. In a prior state of fabrication (e.g. before singulation) the at least one fracture area 160 may have been an area where the first semiconductor die 110 has been connected to a semiconductor wafer. According to an example, one or more fracture areas 160 are arranged on the second main face 112 but no fracture area 160 is arranged on the lateral faces 113. According to another example, one or more fracture areas 160 are arranged on the lateral faces 113 but no fracture area 160 is arranged on the second main face 112. According to yet another example, fracture areas 160 are arranged both on the second main face 112 and on at least one lateral face 113.

The at least one fracture area 160 may have any suitable dimensions and any suitable shape. For example, a width of the fracture area 160 may be in the range of about one hundredth to about one half of the width of the first semiconductor die 110, e.g. about one tenth or about one quarter. The fracture area 160 may for example have an essentially round shape, rectangular shape, quadratic shape, etc. A single fracture area 160 may for example be arranged essentially in the middle of the second main face 112, or two or more fracture areas 160 may be arranged in any suitable geometric pattern, e.g. a symmetric pattern. The at least one fracture area 160 may e.g. comprise no more than 50% of the surface area of the second main face 112 and/or the lateral faces 113, or no more than 30%, or no more than 10%.

The bond 130 may be any suitable type of bond that offers sufficient mechanical strength and/or a low electrical resistance. The bond 130 may for example be a eutectic bond, a solder bond, a bond comprising a conductive adhesive, etc. In the case that the bond 130 is a eutectic bond, it may comprise an Al—Ge eutectic alloy (e.g. with an Al content in the range of 60 at % to 90 at %, or it may for example comprise 49 wt % Al and 51 wt % Ge). The Al content of the eutectic bond may be provided by an Al layer (e.g. a structured Al layer) arranged on the first main face 121 of the second semiconductor die 120. The (structured) Al layer may e.g. be arranged within an oxide layer or on top of an oxide layer of the second semiconductor die 110. According to an example, the (structured) Al layer has a thickness in the range of 500 nm to 2 µm, e.g. about 800 nm, about 1 µm, about 1.4 µm, or about 1.6 µm. The Ge content of the eutectic bond may be provided by the semiconductor material of the first semiconductor die 110. The bond 130 may have any suitable thickness and any suitable shape.

With respect to FIGS. 2A to 2F, a method for wafer bonding is shown. This method may for example be used during fabrication of the compound semiconductor device 100.

Figure 2A:
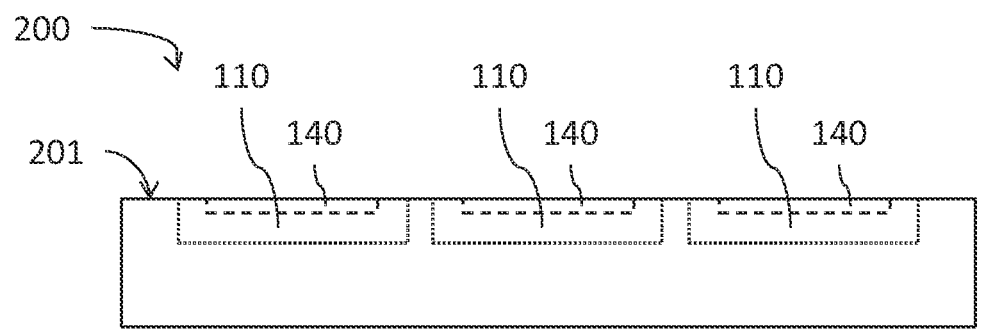
FIGS. 2A-2F show sectional views of a compound semiconductor device in various stages of fabrication according to an exemplary method of wafer bonding.

As shown in FIG. 2A, a semiconductor wafer 200 comprising a first main face 201 is provided. At least one first semiconductor device 140 is fabricated in the semiconductor wafer 200 such that the first semiconductor device 140 is arranged at the first main face 201. In other words, the semiconductor wafer 200 may comprise at least one first semiconductor die 110 which has not been singulated yet.

The semiconductor wafer 200 may for example comprise or consist of Ge or any other suitable semiconductor material, as described further above with respect to the first semiconductor die 110. A thickness of the semiconductor wafer 200 measured between the first main face 201 and an opposing second main face 202 may be much greater than the thickness of the first semiconductor die 110, e.g. more than five times greater, or more ten times greater, or more than 100 times greater.

Figure 2B:
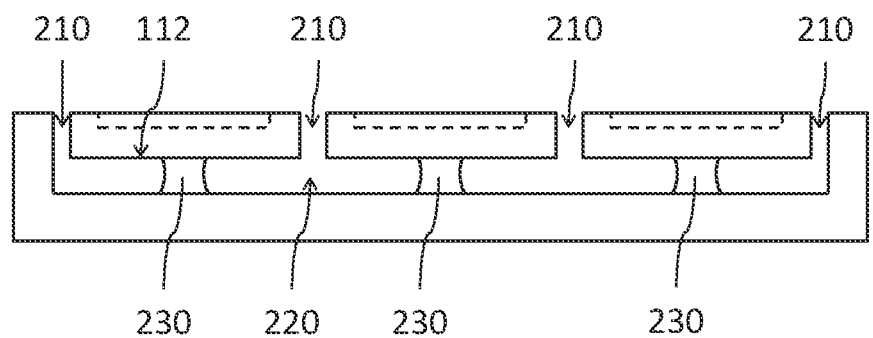

As shown in FIG. 2B, trenches 210 and a cavity 220 are generated in the semiconductor wafer 200 such that the at least one first semiconductor die 110 is connected to the rest of the semiconductor wafer 200 by no more than at least one connecting pillar 230. The at least one connecting pillar 230 may e.g. be part of the semiconductor monocrystal of the semiconductor wafer 200.

The trenches 210 may be arranged laterally next to the semiconductor die 110 and may separate neighboring semiconductor dies 110 from each other. The cavity 220 may be arranged below the second main face 112 of the at least one semiconductor die 110. The trenches 210 and the cavity 220 may be connected to each other such that the semiconductor die 110 is completely surrounded by the trenches 210 and the cavity 220 on the lateral faces 113 and the second main face 112, except for the at least one connecting pillar 230.

Fabricating the trenches 210 and/or the cavity 220 may comprise etching a plurality of pits into the semiconductor wafer 200 and subsequently annealing the semiconductor wafer 200 such that the plurality of pits forms the cavity 220. This process is described in greater detail with respect to FIGS. 3A-3E.

Figure 2C:
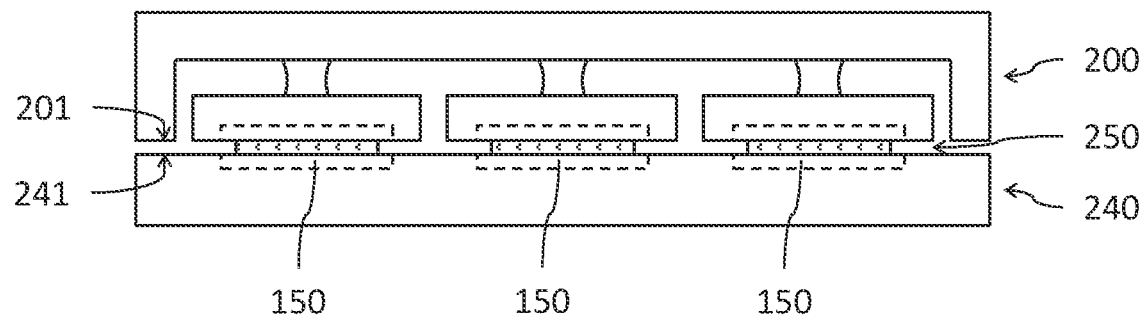

As shown in FIG. 2C, the semiconductor wafer 200 is arranged on a carrier wafer 240 such that the first main face 201 faces the carrier wafer 240. The carrier wafer 240 may for example comprise or consist of Si or any other suitable semiconductor material as described further above with respect to the second semiconductor die 120. However, the carrier wafer 240 does not necessarily need to comprise a semiconductor material. In this case, the carrier wafer 240 may for example comprise or consist of a glass wafer.

The carrier wafer 240 may comprise a first main face 241 facing the semiconductor wafer 200. A bonding material layer 250 may be arranged on the first main face 241. The bonding material layer 250 may be a structured layer or an unstructured layer. The bonding material layer 250 may for example be a metal layer. For example, in the case that eutectic bonding is to be used to attach the semiconductor die 110 to the carrier wafer 240, the bonding material layer 250 may comprise an Al layer. In the case that soldering is to be used, the bonding material layer 250 may comprise solder material. In the case that gluing is to be used, the bonding material layer 250 may comprise (conductive) adhesive.

The carrier wafer 240 may comprise at least one second semiconductor device 150 which may for example be arranged at the first main face 241. Each second semiconductor device 150 may be arranged directly opposite a respective first semiconductor device 140.

Arranging the semiconductor wafer 200 over the carrier wafer 240 may comprise aligning the at least one first semiconductor device 140 with the at least one second semiconductor device 150. Alignment features on the semiconductor wafer 200 and on the carrier wafer 240 may be used to align the wafers 200, 240 with the required accuracy.

Figure 2D:
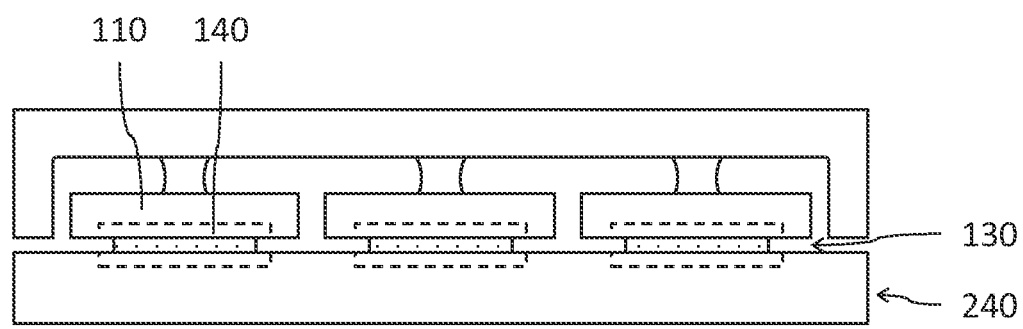

As shown in FIG. 2D, the at least one first semiconductor device 140 (or the at least one first semiconductor die 110) is attached to the carrier wafer 240, thereby forming the bond 130. This may e.g. comprise eutectic bonding or soldering or gluing. The at least one first semiconductor die 110 may be coupled to the carrier wafer 240 by the bond 130 only mechanically or it may be coupled to the carrier wafer 240 by the bond 130 both mechanically and electrically (meaning that the first and second semiconductor devices 140, 150 are electrically coupled to each other by the bond 130).

Figure 2E:
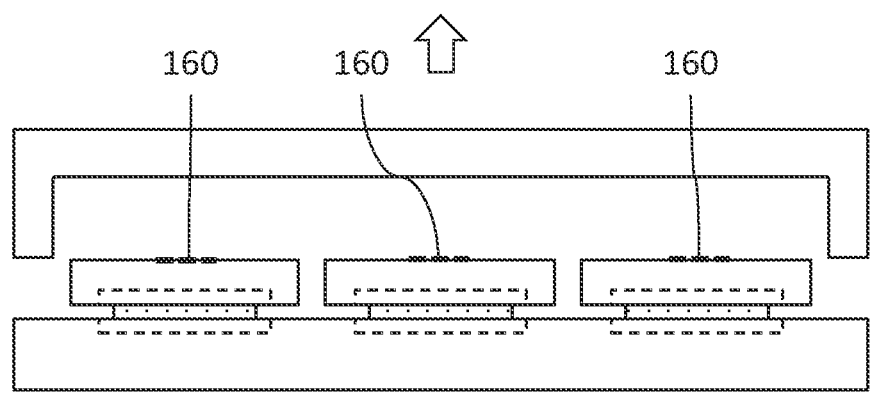

As shown in FIG. 2E, the at least one first semiconductor device 140 (or the at least one first semiconductor die 110) is removed from the semiconductor wafer 200 by breaking the at least one connecting pillar 230. The at least one connecting pillar 230 may for example be broken by applying a mechanical force. For example, simply moving apart the semiconductor wafer 200 and the carrier wafer 240 may break the connecting pillar(s) 230. Alternatively, the semiconductor wafer 200 may be jolted or vibrations induced mechanically or by ultrasonic sound may be used to break the connecting pillar(s).

The strength of the bond 130 may be greater than the strength of the connecting pillar(s) 230 such that the at least one first semiconductor die 110 stays firmly in place on the carrier wafer 240 when the at least one connecting pillar 230 is broken. The strength or stability of the connecting pillar(s) 230 may for example be adjusted by choosing a particular pillar thickness or pillar diameter.

Figure 2F:
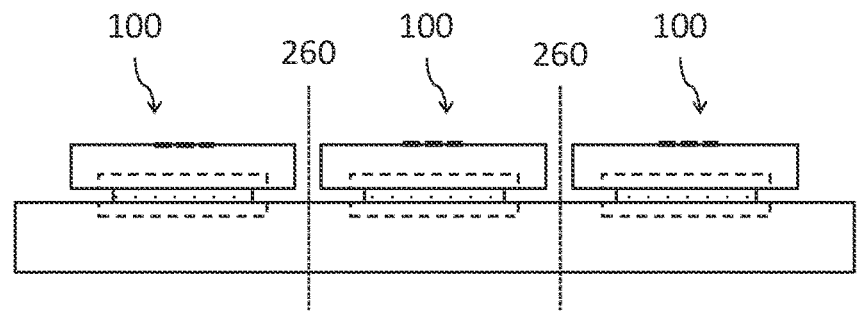

FIG. 2F shows an optional singulation process, wherein at least one second semiconductor die 120 (with the first semiconductor die 110 attached to it) is singulated out of the carrier wafer 240. Singulation may comprise cutting the carrier wafer 240 along cutting lines 260. Singulation in particular does not comprise cutting the semiconductor wafer 200 because the at least one first semiconductor die 110 has already been singulated out of the semiconductor wafer 200 by breaking the at least one connecting pillar 230.

As shown in FIGS. 2A-2F, a multitude of first semiconductor dies 110 may be arranged on and attached to the carrier wafer 240 simultaneously and this multitude of first semiconductor dies 110 may also be simultaneously singulated out of the semiconductor wafer 200 by breaking the respective connecting pillars 230. However, it is also possible that only a single first semiconductor die 110 is arranged on and attached to the carrier wafer 240. In other words, the method of wafer bonding shown in FIGS. 2A-2F may or may not incorporate a batch process.

For example, in the case that only one or only several particular first semiconductor die(s) 110 out of a multitude of first semiconductor dies 110 comprised in the semiconductor wafer 200 is/are to be attached to the carrier wafer 240, bonds 130 may be fabricated selectively only under this/these first semiconductor die(s) 110.

According to an example, the second main face 112 of the at least one first semiconductor die 110 may be polished after removing the at least one first semiconductor die 110 from the semiconductor wafer 200. In this case, the second main face 112 does not comprise the fracture area 160.

With respect to FIGS. 3A to 3E an exemplary method for generating the trenches 210 and the cavity 220 in the semiconductor wafer 200 is described. Such a method is for example described in greater detail in the US 2014/0097521 A1 for the example of a Si wafer.

Figure 3A:
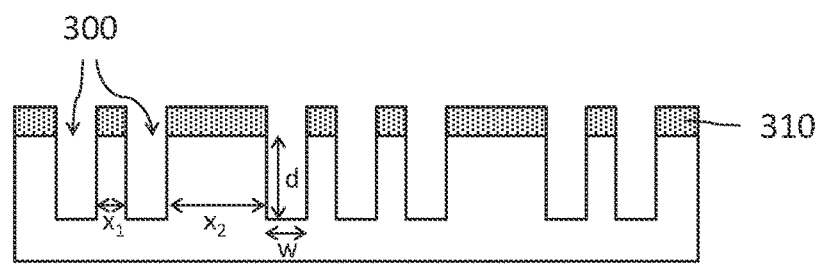
FIGS. 3A-3E show an exemplary method of generating trenches and a cavity in a semiconductor wafer.

As shown in FIG. 3A, a plurality of pits 300 is generated in the semiconductor wafer 200, e.g. by anisotropic etching. This may comprise applying a resist layer 310 (e.g. an organic resist or an inorganic resist like an oxide) to the semiconductor wafer 200 and patterning the resist layer 310 (e.g. by photolithographic means). The pits 300 are then etched into those parts of the semiconductor wafer 200 that are not protected by the patterned resist layer 310.

The pits 300 may for example have a depth d of about 1 μm to about 10 μm. The pits 300 may e.g. have a width w of about 0.1 μm to about 1 μm. Adjacent pits 300 may e.g. be arranged at a spacing $x_1$ of about 0.1 μm to about 1 μm, e.g. about 0.5 μm. However, in regions where a connecting pillar 230 shall be created, adjacent pits 300 may be arranged at a second spacing $x_2$, wherein $x_2 > x_1$. For example, $x_2$ may be about 0.9 μm or more. According to an example, $x_2$ is equal to or smaller than 3 μm, or equal to or smaller than 2.5 μm, or equal to or smaller than 2 μm.

Figure 3B:
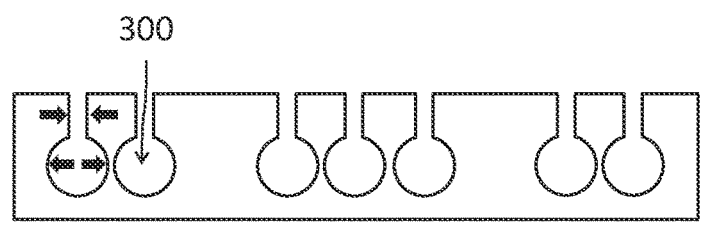
Figure 3C:
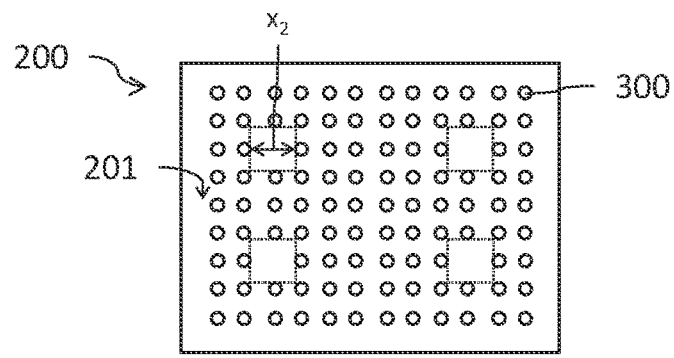

As shown in FIG. 3B, the resist layer 310 is removed and an annealing process is applied to the semiconductor wafer 200. The annealing process causes a shape change of the pits 300 due to an increase in surface diffusivity of atoms on the exposed surfaces within the pits 300. FIG. 3C shows a view down onto a section of the semiconductor wafer 200 in the state of fabrication shown in FIG. 3B.

Figure 3D:
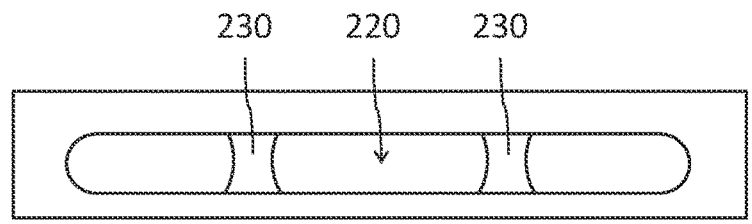

As shown in FIG. 3D, upon further annealing, the globular shaped bottom parts of the pits 300 coalesce to form the cavity 220, whereas the top parts of the pits 300 may close off completely. Connecting pillars 230 remain in those parts where the pits 300 were arranged at the spacing $x_2$.

The annealing process may e.g. be performed at a temperature in the range of about 900° C. to about 1150° C.; a pressure in the range of about 1 Torr to about 760 Torr, particularly a range of about 10 Torr to about 30 Torr; an annealing time may be in the range of about 1 min to about 60 min; a hydrogen atmosphere may be used during annealing.

Figure 3E:
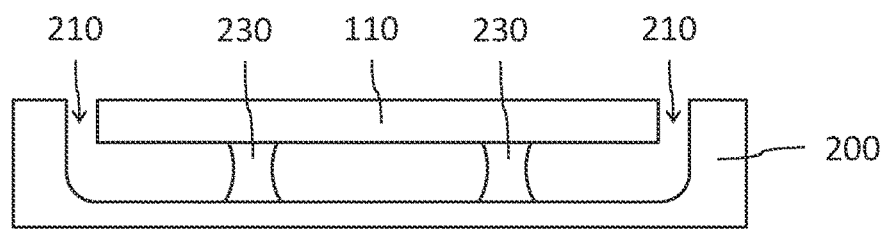

As shown in FIG. 3E, the trenches 210 may be etched into the semiconductor wafer 200. At this point, the first semiconductor die(s) 110 is/are physically connected to the rest of the semiconductor wafer 200 solely by the at least one connecting pillar 230.

Figure 4A:
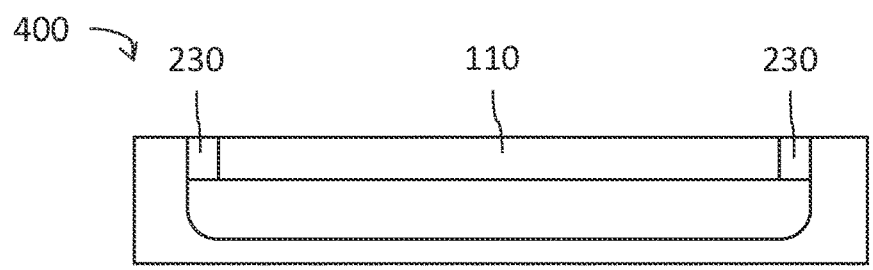
FIGS. 4A and 4B show a further exemplary semiconductor wafer, wherein connecting pillars coupling a semiconductor die to the rest of the wafer are arranged along lateral faces of the die.
Figure 4B:
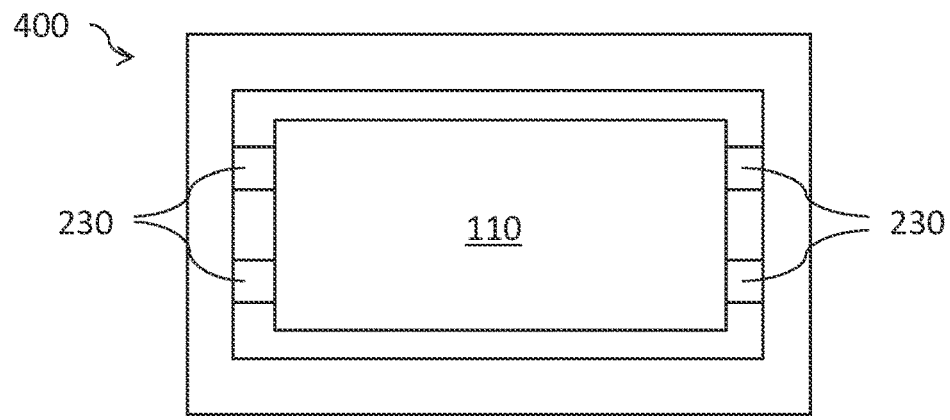

FIGS. 4A and 4B show a further semiconductor wafer 400 which may be similar to or identical with the semiconductor wafer 200, except for the differences described in the following. FIG. 4A shows a sectional view and FIG. 4B shows a top view.

In the semiconductor wafer 400, connecting pillars 230 are arranged on the lateral faces 113 of the first semiconductor die(s) 110 instead of on the second main face 112 as in the semiconductor wafer 200. The connecting pillars 230 may e.g. be arranged on two opposing lateral faces 113 or on all four lateral faces 113.

Figure 5:
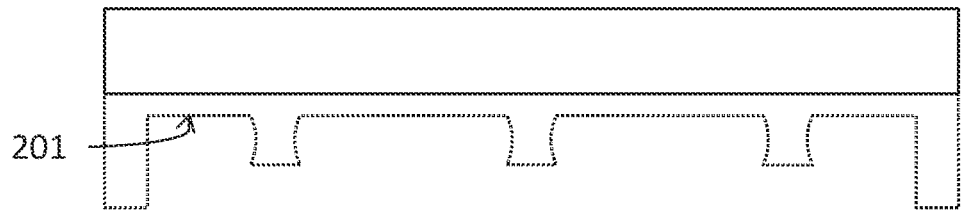
FIG. 5 shows an exemplary method of reusing a semiconductor wafer after at least one semiconductor die has been singulated out of the wafer.

FIG. 5 shows an exemplary method of reusing the semiconductor wafer 200 after the at least one first semiconductor die 110 has been singulated as shown in FIG. 2E.

As shown in FIG. 5, a grinding process (e.g. CMP) may be used to grind away residuals on the first main face 201 and to re-flatten the semiconductor wafer 200. Afterwards, the semiconductor wafer 200 may be cleaned and one or more new first semiconductor devices 140 and respective first semiconductor dies 110 may be fabricated in the semiconductor wafer 200. For example, no more than about 500 μm may have to be ground away from the semiconductor wafer 200 which means that it may be possible to reuse one particular semiconductor wafer 200 several times, significantly reducing fabrication costs.

Figure 6:
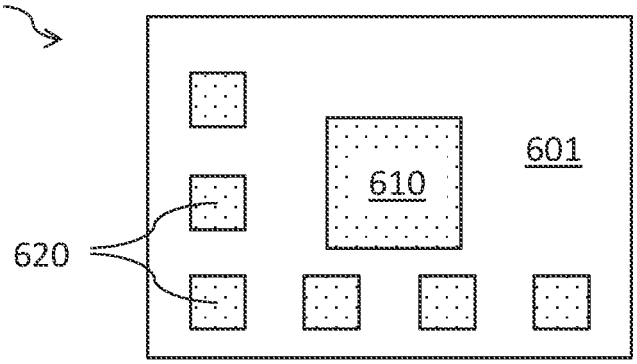
FIG. 6 shows a top view of a further exemplary semiconductor die which comprises a first pad for generating a mechanical connection to another semiconductor die as well as separate second pads for providing electrical connections to the other semiconductor die.

FIG. 6 shows a top view onto a first main face 601 of a further second semiconductor die 600. The further second semiconductor die 600 may be similar to or identical with the second semiconductor die 120, except for the differences described in the following.

The further second semiconductor die 600 comprises a bond pad 610 and a plurality of electrical connection pads 620 different from the bond pad 610. The bond pad 610 may be used to fabricate the bond 130 which solely mechanically couples the first and second semiconductor dies 110, 120 to each other. The electrical connection pads 620 may be used to fabricate electrical connections between the first and second semiconductor devices 140, 150. In other words, a mechanical and an electrical coupling between the semiconductor dies 110, 600 of a compound semiconductor device 100 are split up.

According to another example, the bond pad 610 is electrically coupled to the second semiconductor device 150 and both an electrical and a mechanical connection between the first and second semiconductor dies 110, 600 is provided by forming the bond 130 at the bond pad 610. In this case, the electrical connection pads 620 provide additional electrical connections.

Figure 7:
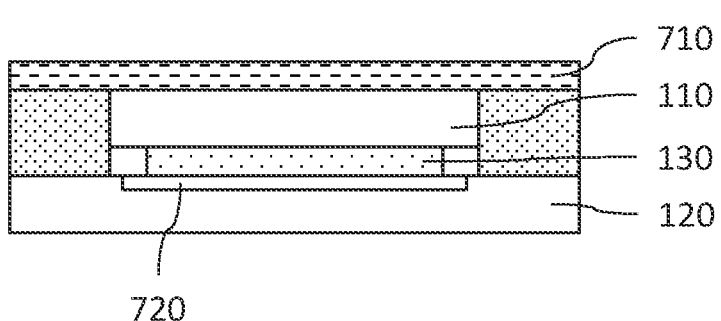
FIG. 7 shows a sectional view of a semiconductor module comprising a compound semiconductor device.

FIG. 7 shows an exemplary semiconductor module 700 comprising the compound semiconductor device 100. The semiconductor module 700 comprises an optical filter 710 arranged over the second main face 112 of the first semiconductor die 110. The semiconductor module 700 may e.g. further comprise a reflector 720 arranged on the second semiconductor die 120 below the first main face 111 of the first semiconductor die 110. The first semiconductor die 110 of the semiconductor module 700 may e.g. comprise an optical sensor or an LED and the second semiconductor die 120 may e.g. be a CMOS die configured to control the first semiconductor die 110. The semiconductor module 700 may comprise additional components like an encapsulation, a carrier, external contacts, etc.

Figure 8:
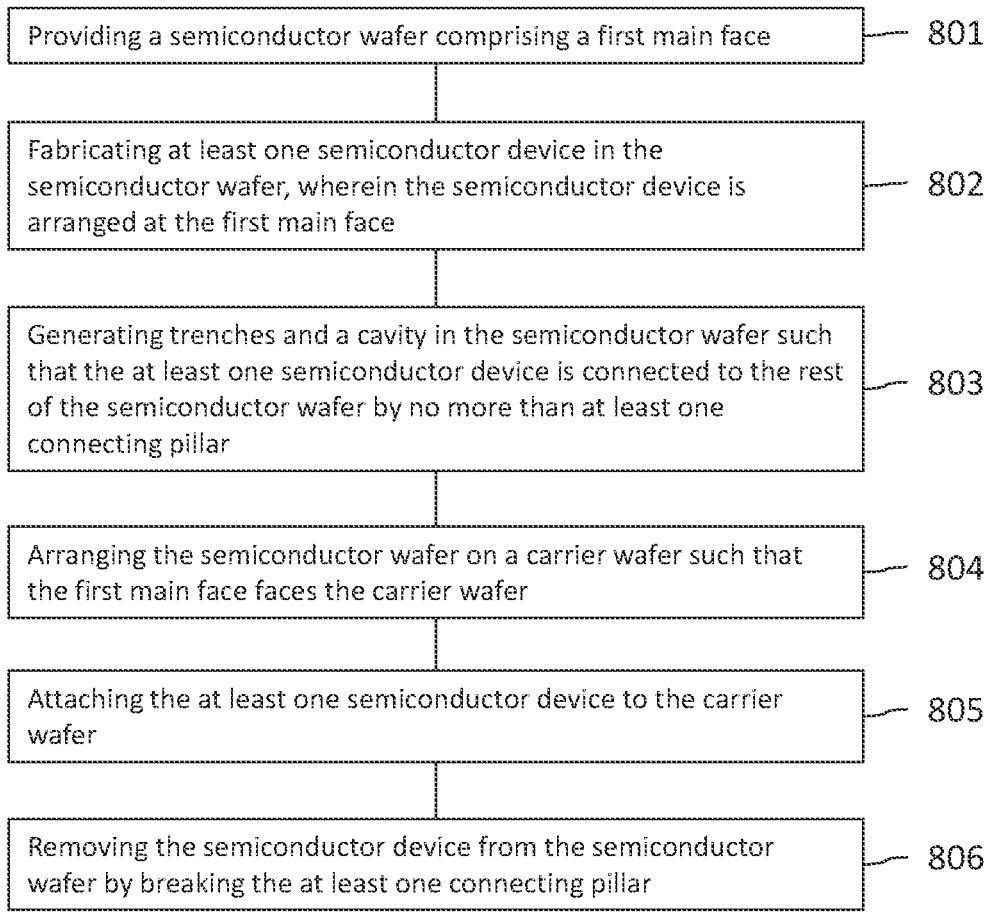
FIG. 8 is a flow chart of an exemplary method for wafer bonding.

FIG. 8 is a flow chart of a method 800 for wafer bonding. The method 800 comprises at 801 an act of providing a semiconductor wafer comprising a first main face, at 802 an act of fabricating at least one semiconductor device in the semiconductor wafer, wherein the semiconductor device is arranged at the first main face, at 803 an act of generating trenches and a cavity in the semiconductor wafer such that the at least one semiconductor device is connected to the rest of the semiconductor wafer by no more than at least one connecting pillar, at 804 an act of arranging the semiconductor wafer on a carrier wafer such that the first main face faces the carrier wafer, at 805 an act of attaching the at least one semiconductor device to the carrier wafer, and at 806 an act of removing the semiconductor device from the semiconductor wafer by breaking the at least one connecting pillar.

In the following, the method for wafer bonding and the compound semiconductor device are further described using specific examples.

Example 1 is a method for wafer bonding, the method comprising: providing a semiconductor wafer comprising a first main face, fabricating at least one semiconductor device in the semiconductor wafer, wherein the semiconductor device is arranged at the first main face, generating trenches and a cavity in the semiconductor wafer such that the at least one semiconductor device is connected to the rest of the semiconductor wafer by no more than at least one connecting pillar, arranging the semiconductor wafer on a carrier wafer such that the first main face faces the carrier wafer, attaching the at least one semiconductor device to the carrier wafer, and removing the semiconductor device from the semiconductor wafer by breaking the at least one connecting pillar.

Example 2 is the method of example 1, wherein the generating comprises etching a plurality of pits into the semiconductor wafer and subsequently annealing the semiconductor wafer such that the plurality of pits forms the cavity.

Example 3 is the method of example 1 or 2, wherein the attaching comprises eutectic bonding.

Example 4 is the method of example 3, wherein the at least one semiconductor device is held in place during the breaking of the at least one connecting pillar by the eutectic bond.

Example 5 is the method of example 3 or 4, wherein the eutectic bonding comprises the formation of an Al—Ge eutectic alloy.

Example 6 is the method of one of the preceding examples, wherein the semiconductor wafer comprises or consists of Ge and wherein the carrier wafer comprises or consists of Si or glass.

Example 7 is the method of one of the preceding examples, wherein the at least one connecting pillar has a diameter of no more than 2 μm.

Example 8 is the method of one of the preceding examples, wherein the at least one connecting pillar consists of the semiconductor material of the semiconductor wafer.

Example 9 is the method of one of the preceding examples, wherein the at least one connecting pillar is arranged in the cavity directly below the at least one semiconductor device.

Example 10 is the method of one of examples 1 to 8, wherein the at least one connecting pillar is arranged in one of the trenches laterally next to the at least one semiconductor device.

Example 11 is the method of one of the preceding examples, wherein breaking the at least one connecting pillar comprises lifting the semiconductor wafer away from the carrier wafer.

Example 12 is the method of one of the preceding examples, further comprising: fabricating at least one further semiconductor device in the carrier wafer, and electrically coupling the at least one further semiconductor device to the at least one semiconductor device.

Example 13 is the method of example 12, wherein the at least one further semiconductor device is coupled to the at least one semiconductor device when the at least one semiconductor device is attached to the carrier wafer.

Example 14 is a compound semiconductor device, comprising: a first semiconductor die comprising a first main face, an opposing second main face and lateral faces connecting the first and second main faces, wherein a first semiconductor device is provided by the first semiconductor die, a second semiconductor die comprising a first main face, wherein the first main faces of the first and second semiconductor dies face each other, wherein a second semiconductor device is provided by the second semiconductor die, and an eutectic bond arranged between the first main faces and mechanically coupling the first and second semiconductor dies to each other, wherein the first semiconductor die comprises at least one mechanical fracture area on the second main face and/or the lateral faces.

Example 15 is the compound semiconductor device of example 14, wherein the first semiconductor device is an optical device and wherein the second semiconductor device is a control device or a driver device configured to control or to drive the first semiconductor device.

Example 16 is an apparatus comprising means for performing the method according to one of examples 1 to 13.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A method for wafer bonding, the method comprising:
providing a semiconductor wafer comprising a first main face;
fabricating at least one semiconductor die in the semiconductor wafer, wherein the at least one semiconductor die comprises a first main face arranged at the first main face of the semiconductor wafer, an opposing second main face, lateral faces connecting the first and second main faces, at least one mechanical fracture area on the second main face and/or the lateral faces, and at least one semiconductor device in the semiconductor wafer, wherein the at least one semiconductor device is arranged at the first main face of the semiconductor wafer;
generating trenches and a cavity in the semiconductor wafer such that the at least one semiconductor device is connected to the rest of the semiconductor wafer by no more than at least one connecting pillar;
arranging the semiconductor wafer on a carrier wafer such that the first main face of the semiconductor wafer faces the carrier wafer;
attaching the at least one semiconductor device to the carrier wafer; and
removing the at least one semiconductor device from the semiconductor wafer by breaking the at least one connecting pillar.

2. The method of claim 1, wherein the generating comprises etching a plurality of pits into the semiconductor wafer and subsequently annealing the semiconductor wafer such that the plurality of pits forms the cavity.

3. The method of claim 1, wherein the attaching comprises eutectic bonding.

4. The method of claim 3, wherein the at least one semiconductor device is held in place during the breaking of the at least one connecting pillar by a eutectic bond produced by the eutectic bonding.

5. The method of claim 3, wherein the eutectic bonding comprises formation of an Al-Ge eutectic alloy.

6. The method of claim 1, wherein the semiconductor wafer comprises Ge, and wherein the carrier wafer comprises Si or glass.

7. The method of claim 1, wherein the at least one connecting pillar has a diameter of no more than 2 μm.

8. The method of claim 1, wherein the at least one connecting pillar consists of the semiconductor material of the semiconductor wafer.

9. The method of claim 1, wherein the at least one connecting pillar is arranged in the cavity directly below the at least one semiconductor device.

10. The method of claim 1, wherein the at least one connecting pillar is arranged in one of the trenches laterally next to the at least one semiconductor device.

11. The method of claim 1, wherein breaking the at least one connecting pillar comprises lifting the semiconductor wafer away from the carrier wafer.

12. The method of claim 1, further comprising:
fabricating at least one further semiconductor device in the carrier wafer; and
electrically coupling the at least one further semiconductor device to the at least one semiconductor device.

13. The method of claim 12, wherein the at least one further semiconductor device is coupled to the at least one semiconductor device when the at least one semiconductor device is attached to the carrier wafer.

14. A compound semiconductor device, comprising:
a first semiconductor die comprising a first main face, an opposing second main face, and lateral faces connecting the first and second main faces, wherein a first semiconductor device is provided by the first semiconductor die;
a second semiconductor die comprising a first main face, wherein the first main faces of the first and second semiconductor dies face each other, wherein a second semiconductor device is provided by the second semiconductor die; and
an eutectic bond arranged between the first main faces and mechanically coupling the first and second semiconductor dies to each other,
wherein the first semiconductor die comprises at least one mechanical fracture area on the second main face and/or the lateral faces.

15. The compound semiconductor device of claim 14, wherein the first semiconductor device is an optical device, and wherein the second semiconductor device is a control device or a driver device configured to control or to drive the first semiconductor device.

* * * * *